United States Patent
Kull et al.

(10) Patent No.: US 9,608,585 B2
(45) Date of Patent: Mar. 28, 2017

(54) DYNAMIC CURRENT SOURCE FOR ZERO-CROSSING AMPLIFIER UNITS FOR USE IN HIGH-SPEED COMMUNICATION CIRCUITS

(71) Applicant: International Business Machines Corporation, Armonk, NY (US)

(72) Inventors: Lukas Kull, Zurich (CH); Thomas Toifl, Zurich (CH)

(73) Assignee: International Business Machines Corporation, Armonk, NY (US)

(*) Notice: Subject to any disclaimer, the term of this patent is extended or adjusted under 35 U.S.C. 154(b) by 338 days.

(21) Appl. No.: 14/157,690

(22) Filed: Jan. 17, 2014

(65) Prior Publication Data

US 2014/0210553 A1    Jul. 31, 2014

(30) Foreign Application Priority Data

Jan. 31, 2013   (GB) .................................. 1301665.4

(51) Int. Cl.
 *H03G 3/30* (2006.01)
 *H03M 1/06* (2006.01)
 *H03G 1/00* (2006.01)
 *H03M 1/50* (2006.01)

(52) U.S. Cl.
 CPC ......... *H03G 3/3042* (2013.01); *H03G 1/0029* (2013.01); *H03M 1/0607* (2013.01); *H03G 1/0005* (2013.01); *H03G 3/3005* (2013.01); *H03M 1/50* (2013.01)

(58) Field of Classification Search
 USPC ................................. 330/259, 278–280, 290
 See application file for complete search history.

(56) References Cited

U.S. PATENT DOCUMENTS

| | | | |
|---|---|---|---|
| 5,032,972 A * | 7/1991 | Erckert | ............................ 363/97 |
| 6,753,729 B2 * | 6/2004 | Broadley | .................. 330/207 A |
| 7,746,671 B2 * | 6/2010 | Radecker et al. | .......... 363/21.03 |
| 2007/0024267 A1 | 2/2007 | Lee | |
| 2011/0285563 A1 | 11/2011 | Chen et al. | |
| 2012/0268304 A1 | 10/2012 | Lin et al. | |
| 2012/0293232 A1 | 11/2012 | Guyton et al. | |
| 2013/0215655 A1 * | 8/2013 | Yang et al. | ...................... 363/89 |

OTHER PUBLICATIONS

Musah et al., "A 630μ W Zero-Crossing-Based ΔΣ ADC Using Switched-Resistor Current Sources in 45nm CMOS", IEEE 2009 Custom Intergrated Circuits Conference (CICC), pp. 1-4.

(Continued)

*Primary Examiner* — Khanh V Nguyen
(74) *Attorney, Agent, or Firm* — L. Jeffrey Kelly

(57) ABSTRACT

A zero-crossing amplifier unit for use in high speed analog-digital-converters. A gain stage compares a sampling voltage at an input node with a provided threshold voltage to obtain a gain stage output signal. A voltage controlled current source provides a load current depending on a time window between an initial slope and an end slope of the gain stage output signal. A slope control means increases a duration of a rise and/or fall time of at least one of the initial and end slopes of the gain stage output signal.

18 Claims, 4 Drawing Sheets

(56) References Cited

OTHER PUBLICATIONS

Chu, "A High Performance Zero-Crossing Based Pipelined Analog-to-Digital Converter", Submitted to the Dept. of Electrical Engineering and Computer Science in partial fulfillment of the requirements for the degree of Master of Science in Electrical Engineering and Computer Science at the Massachusetts Institute of Technology, Jun. 2008, pp. 1-47.
Chu et al., "A Zero-Crossing Based 12b 100MS/s Pipelined ADC with Decision Boundary Gap Estimation Calibration".
GB Search Report, dated Jul. 4, 2013, for Application No. GB1301665.4 filed Jan. 31, 2013.
Brooks et al., "A Zero-Crossing-Based 8-bit 200 MS/s Pipelined ADC", IEEE Journal of Solid-State Circuits, vol. 42, No. 12, Dec. 2007, pp. 2677-2687.
Brooks et al., "A 12b 50MS/s Fully Differential Zero-Crossing-Based ADC Without CMFB", ISSCC 2009 / Session 9 / Data Converter Techniques / 9.3, pp. 166-168.
Brooks et al., "A 12b 50MS/s Fully Differential Zero-Crossing-Based ADC Without CMFB", ISSCC, Feb. 2009, pp. 1-33.
GB Application No. 1301665.4, filed on Jan. 31, 2013, entitled: "Dynamic current source for zero-crossing amplifier units for use in high-speed communication circuits", 17 pages.

* cited by examiner

DYNAMIC CURRENT SOURCE FOR ZERO-CROSSING AMPLIFIER UNITS FOR USE IN HIGH-SPEED COMMUNICATION CIRCUITS

CROSS-REFERENCE TO RELATED APPLICATIONS

This application claims the benefit of priority of United Kingdom Patent Application Serial Number 1301665.4, filed Jan. 31, 2013, which is hereby incorporated by reference in its entirety

FIELD OF THE INVENTION

The present invention relates to zero-crossing amplifier units for high-speed communication circuits, in particular for high-speed analog-to-digital converters.

BACKGROUND OF THE INVENTION

Analog-to-digital converters can be implemented with different topologies. In particular, interleaved and pipelined analog-to-digital converters require gain stages which need to be operable at very high-speed. The main requirements for these gain stages are to obtain a gain of more than 1 in a short time while preserving linearity.

Among the broad variety of ADC topologies, ADCs with zero-crossing amplifier units have recently gained attention for use in high-speed high-resolution applications. In particular, applications which require sampling rates of more than 1 GS/s require very fast operating gain stages.

Y. Chu, "A high performance zero-crossing-based pipelined analog-to-digital converter", http://dspace.mit.edu/bitstream/handle/1721.1/44377/276947916.pdf?sequence=1, DSpace@MIT, discloses a method for dynamically controlling a current source at the output of a zero-crossing amplifier in an analog-to-digital converter for improved linearity. To improve the current source linearity, a dynamic biasing scheme is employed to compensate for its finite output impedance. In particular, it also discloses to generate a dynamic bias voltage to apply to a gate of a MOSFET to compensate for a decreasing ramp rate at an output node. As the output voltage rises, the bias voltage applied to the gate of the MOSFET is reduced, which makes the amount of current sourced by the MOSFET constant and therefore compensates for the reduction in the ramp rate.

SUMMARY

According to an embodiment of an aspect of the invention a zero-crossing amplifier unit for use in high speed analog-digital-converters is provided. A gain stage compares a sampling voltage at an input node with a provided threshold voltage to obtain a gain stage output signal. A voltage controlled current source provides a load current depending on a time window given by the gain stage output signal. A slope control means increases a duration of a rise and/or fall time of at least one slope of the gain stage output signal. Another embodiment further includes a load capacitance at an output node that is loaded by the load current, and a feedback element for coupling the output node with the input node, so that a voltage change at the output node is reflected at the input node.

One aspect of the above embodied amplifier unit is that the gain stage output signal, which is conventionally used for current control of a voltage controlled current source has means to modify the raising and/or falling slopes at a zero crossing detected. The modification shapes the slopes of the gain stage output prior to applying to the control input of the current source. Thus, the current source is kept from experiencing a hard turn on or off when the gain stage detects a zero crossing. In high-speed applications, a delayed turn-on of the current source could result in the time to turn off the current source via the gain stage being not sufficient, thereby causing a non-linearity for high-input/low-output voltages. By controlling the current by means of the slope control means, a well-defined current turn-on and turn-off slope can be generated.

Moreover, the gain stage may be controlled to provide the gain stage output signal with the initial slope at an initial time and with the end slope when the voltage at the input node passes the threshold voltage due to the coupling with the output node; wherein the slope control means at least increases the duration of the rise and/or fall time of the initial slope.

Furthermore, the voltage controlled current source may comprise a MOSFET transistor, wherein the slope control means comprises a current mirror to set a current used for recharging a gate terminal of the MOSFET transistor. Particularly, the voltage controlled current source may be merely formed by a MOSFET transistor.

According to an embodiment, the current mirror may be configured to set the current by means of at least one of a control current, a control voltage and a transistor parameter.

It may be provided that the slope control means may be included in the gain stage to increase the duration of a rise and/or fall time of at least one slope of the gain stage output signal output by the gain stage.

Furthermore, it may be provided that the gain stage is formed by a transistor or by a differential amplifier.

According to an embodiment of a further aspect a method for operating a zero-crossing amplifier unit for use in high speed analog-digital-converters is provided. The method comprises the steps of: comparing a sampling voltage at an input node with a provided threshold voltage to obtain a gain stage output signal; providing a load current depending on a time window between an initial slope and an end slope of the gain stage output signal so that a load capacitance at an output node is loaded by the load current; and increasing a duration of a rise and/or fall time of at least one of the initial and end slopes of the gain stage output signal.

Furthermore, the output node may be coupled with the input node, so that a voltage change at the output node is reflected at the input node.

BRIEF DESCRIPTION OF THE SEVERAL VIEWS OF THE DRAWINGS

Preferred embodiments of the present invention are described in more detail in conjunction with the accompanying drawings, in which.

DETAILED DESCRIPTION

Figure 1:
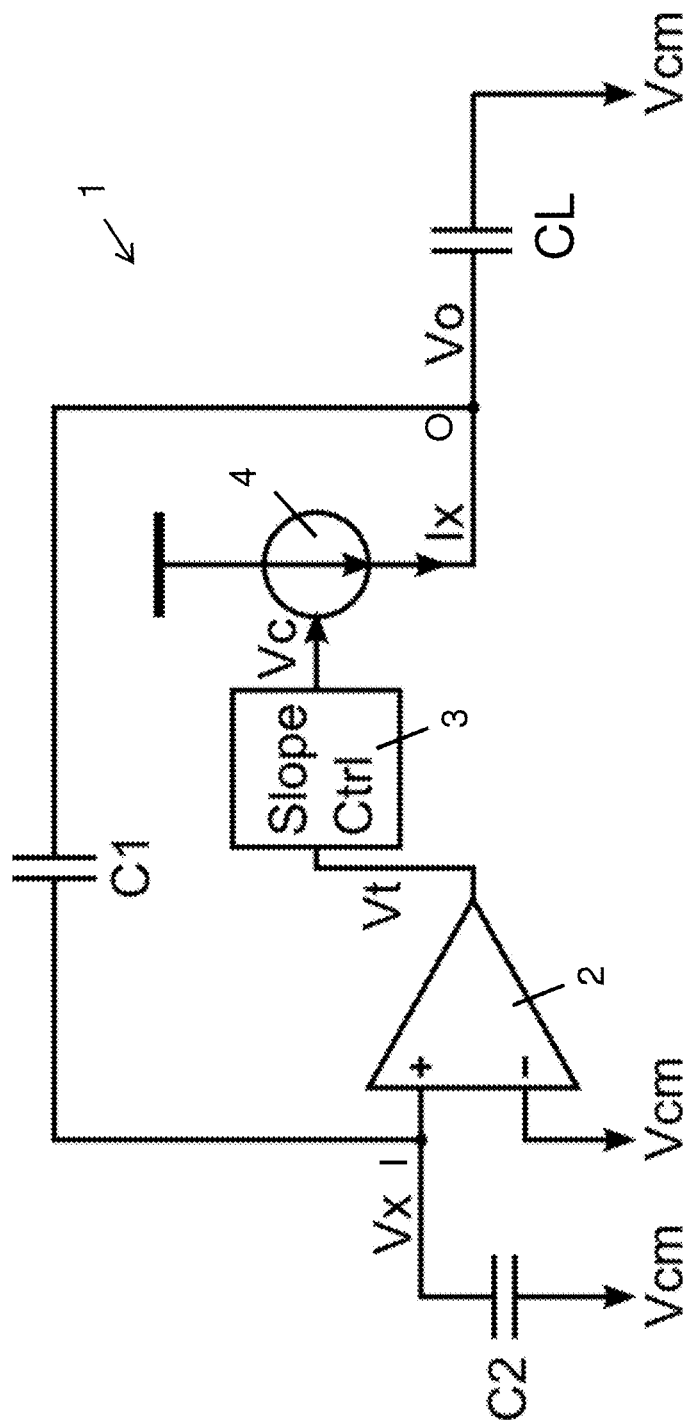
FIG. 1 schematically shows a functional circuit diagram of a zero-crossing amplifier unit according to an embodiment.

The zero-crossing amplifier unit 1 as shown in FIG. 1 substantially comprises a gain stage 2 with an inverting and non-inverting input. The gain stage 2 is configured to perform a comparison between the input voltages applied to its inputs. The inverting input of the gain stage 2 is coupled to a provided common mode voltage Vcm as a given threshold voltage. A sampling voltage Vx externally supplied via an input node I is provided to the non-inverting input of the gain stage 2.

The gain stage 2 is configured to perform an amplification of the input voltage difference with a predetermined gain. Substantially, when the sign of the difference of the input voltages, i.e. sampling voltage Vx and the common mode voltage Vcm (or any other fixed voltage reference), at the inputs of the gain stage 2 changes, a relatively high gradient slope between the supply potentials of the gain stage 2, i.e. VDD and VGND, is provided at its output.

The output of the gain stage 2 provides a gain stage output signal Vt which is provided to a slope control unit 3 which serves as slope control means.

An input capacitor C2 is provided, a first terminal of which is coupled to the non-inverting input of the gain stage 2 while a second terminal of the input capacitor C2 is coupled to a given common mode voltage Vcm.

Furthermore, the zero-crossing amplifier unit 1 has an output node O at which an amplified output voltage Vo can be obtained. Between the output node O and the provided common mode voltage Vcm an output capacitor CL is provided. In detail, a first terminal of the output capacitor CL is coupled to the output node O while a second terminal of the output capacitor CL is coupled to the common mode voltage Vcm.

Furthermore, a feedback capacitor C1 is provided for coupling the output node O and an input node I coupled with the non-inverting input of the gain stage 2.

The slope control unit 3 is configured to shape the gain stage output signal Vt to obtain a current control signal Vc. The current control signal Vc is applied to a voltage-controlled current source 4 which provides a controlled output current Ix to the output node O. Substantially the voltage controlled current source 4 is provided by a MOSFET transistor. The controlled output current Ix loads (charges or discharges) the output capacitor CL to the amplified output voltage Vo corresponding to the input voltage Vx. The slope control unit 3 is configured to soften the hard edges of the gain stage output signal Vt, so that the voltage-controlled current source 4 is not hard switched by the initial slope of the gain stage output voltage Vt.

The above circuit operates by loading the output capacitor CL with the controlled output current Ix by a specific time depending on the sampling voltage Vx. This is achieved in that by providing the sampling voltage to the gain stage 2 a first edge is provided which starts the generation of the controlled output current Ix. The controlled output current Ix loads the output capacitor so that its voltage rises. Through feedback capacitor C1 the rising voltage is coupled to the input node whereat the sampling voltage Vx has been initially supplied thereby changing the voltage at the input node I towards the common mode voltage Vcm. As soon as the voltage at the input node I passes the common mode voltage Vcm a second edge of the gain stage output signal Vt is generated which stops the generation of the controlled output current Ix and so the loading of the output capacitor CL which then provided the output voltage Vo.

Generally, due to parasitic capacitances, a MOSFET used as the voltage-controlled current source 4 requires e.g. 10 to 15 ps (for 32 nm CMOS technology) to be turned on or turned off, respectively. The time during which the current value of Ix, by which the output capacitor CL is loaded, flows does not depend linearly from the sampling voltage Vx.

Hence, by using the slope control unit 3 it could be avoided that the time between turning on and turning off the voltage-controlled current source 4 by means of the gain stage output signal Vt is not sufficient to provide a turn-on time of the controlled output current Ix which is linear to the sampling voltage Vx, in particular at low sampling voltages Vx. By controlling the voltage-controlled current source 4 with the current control voltage Vc provided by the slope control unit 4, the current at which parasitic capacitances are discharged, a well-defined current turn-on and turn-off slope can be generated. This results in an improved linearity for high-input and low-output voltages.

Figure 2:
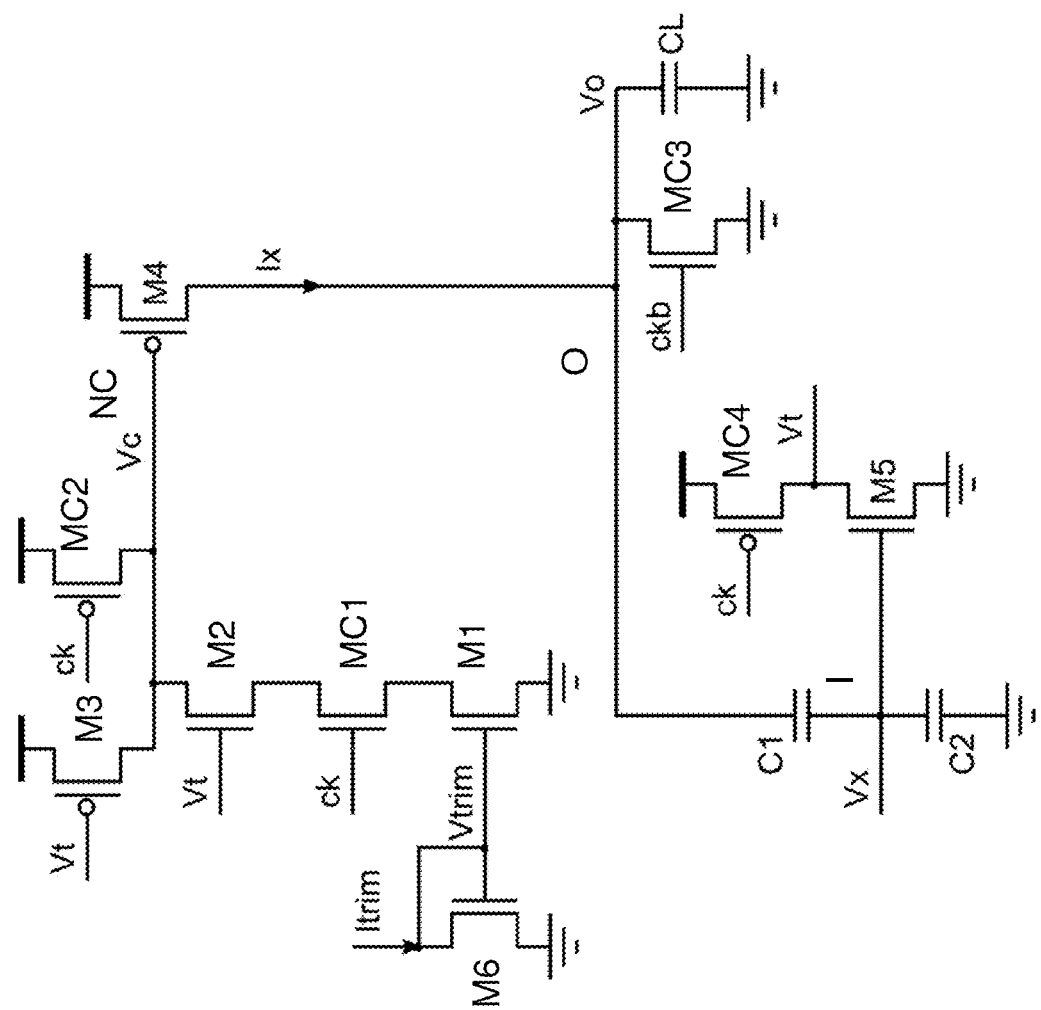
FIG. 2 shows a detailed schematic of a further embodiment of a zero-crossing amplifier unit.

FIG. 2 shows a full circuit implementation of the zero-crossing amplifier unit 1 of FIG. 1. It can be seen that the circuit schematically illustrated in FIG. 1 is formed with a first to sixth transistor M1-M6. In addition, clock transistors MC1 to MC4 are used. The gain stage 2 is implemented by the fifth MOSFET M5, the slope control unit 3 is formed by the first, second, third and sixth MOSFET transistors M1, M2, M3, M6, and the first and second clock transistors MC1 and MC2, and the voltage-controlled current source 4 is formed by the fourth MOSFET transistor M4.

In general, the setup of the slope control unit 3 is as follows:

The first transistor M1, the first clock transistor MC1, and the second transistor M2 are provided as N-MOSFET transistors (first conductivity type) and are connected in series between a control node NC and a second supply potential, i.e. a ground potential VGND, which usually corresponds to the common mode voltage Vcm according to the circuit shown in FIG. 1. The third transistor M3 is provided as a P-MOSFET (second conductivity type) and is connected to a first terminal with a first supply potential VDD and to a second terminal with the control node NC. A second clock transistor MC2 is provided as a P-MOSFET in parallel to the third transistor M3. A first terminal of the second clock transistor MC2 is connected with the first supply potential VDD and a second terminal of the second clock transistor MC2 is connected with the control node NC.

A gate terminal (control terminal) of the first transistor M1 is provided with a trimming voltage Vtrim, provided by a sixth transistor M6. The sixth transistor M6 is an N-MOSFET, wherein its first terminal receives a preset trimming current Itrim and its second terminal is connected to the ground potential VGND. The first terminal of the sixth transistor M6 is further connected to both a gate terminal of the sixth transistor M6 and the first transistor M1.

A first terminal of the second transistor M2 is connected to the control node NC while a second terminal is connected to a first terminal of the first clock transistor MC1. A second terminal of the first clock transistor MC1 is connected to a first terminal of the first transistor M1, the second terminal of which is connected to the ground potential VGND.

The control node NC is further connected to the voltage-controlled current source 4 provided by the fourth transistor M4. The fourth transistor M4 is provided as a P-MOSFET.

A first terminal of the fourth transistor M4 is connected to the first supply potential VDD and a second terminal of the fourth transistor M4 is connected to the output node O.

The output node O is connected to a first terminal of the output capacitor CL, a first terminal of a third clock transistor MC3 and a first terminal of the feedback capacitor C1. The second terminal of the output capacitor CL and the second terminal of the third clock transistor MC3 are connected to the ground potential VGND. A second terminal of the feedback capacitor C1 is connected to the input voltage Vx at the input node I.

A first terminal of the input capacitor C2 is connected to the input node I while the second terminal of the in particular capacitor C2 is connected to the ground potential VGND.

In the present embodiment, the gain stage 2 is simply formed by a fourth clock transistor MC4 and a fifth transistor M5, which are connected in series. A first terminal of the fourth clock transistor MC4 is connected to the first supply potential VDD while a second terminal of the fourth clock transistor MC4 is connected to a first terminal of the fifth transistor M5, the second terminal of which is connected to the ground potential VGND. The voltage difference detected thereby is between the input voltage Vx and an intrinsic threshold voltage Vth of the fifth transistor M5.

The second terminal of the fourth clock transistor MC4 and the first terminal of the fifth transistor M5 are connected to the gate terminals of the third transistor M3 and the second transistor M2. The gate terminals of the second clock transistor MC2 and the first clock transistor MC1 are supplied with a clock signal ck while the gate terminal of the third clock transistor MC3 is provided with an inverted clock signal ckb.

The operation of the zero-crossing amplifier unit 1 is as follows:

When an input voltage Vx is sampled on an input node I, the sampling capacitance corresponds to the combined capacitance of the feedback capacitor C1 and the input capacitor C2 as well as the gate capacitance of the fifth transistor M5. The input voltage Vx has to be below a threshold voltage of the fifth transistor M5. To start the amplification, the clock signal ck is raised to a high level, thereby turning on the operation of the zero-crossing amplifier unit 1. The current control voltage Vc on the control node NC is pulled towards the ground potential VGND which corresponds to a low signal level. The slope towards the low level has a defined characteristic due to the preset trimming current Itrim so that it turns on the fourth transistor M4 in a controlled manner.

This charges the feedback capacitor C1 connected to the input node I and as a consequence, due to the capacity divider between the feedback capacitor C1 and the input capacitor C2 at the input node I results in a rising potential at the input node I. When the voltage at the input node approaches the threshold voltage of the fifth transistor M5, the output of the gain stage 2 gets quickly discharged and as a consequence the current control voltage Vc is pulled high by the conductive fourth clock transistor MC4.

When the voltage-controlled current source 4 formed by the fourth transistor M4 is turned off, the amplification is finished. Prior to the next sampling cycle, the clock signal ck is set to a low level, which resets the feedback capacitor C1 on the output node O to the ground potential VGND.

Figure 3:
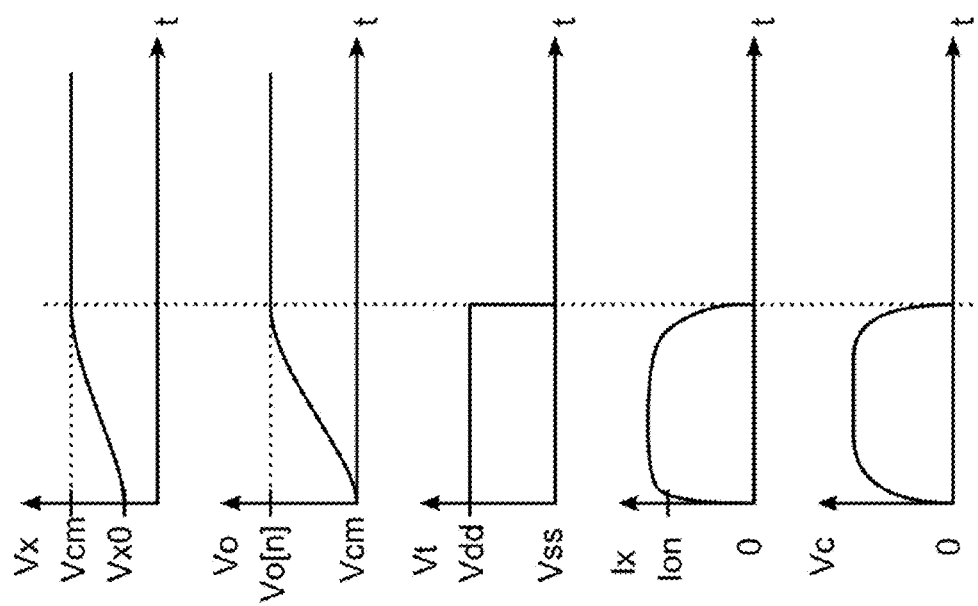
FIG. 3 shows diagrams illustrating characteristics of the input voltage, the gain stage output voltage, a feedback voltage, the controlled current and the current source control voltage.

In the diagrams of FIG. 3, the timely characteristic of the input voltage Vx, the output voltage Vo, the gain stage output voltage Vt, the controlled output current Ix and the current control voltage Vc are illustrated. It can be seen that due to the formed current control voltage Vc, the controlled output current Ix has a softer slope at its beginning and its end of the sampling cycle.

As can be seen in the characteristic of the output voltage Vo, a beginning portion and an end portion of the slope of the output voltage Vo is shaped or flattened, respectively, thereby minimizing the effect of a turn-on and turn-off delay of the voltage-controlled current source 4. While the signal at the output of the gain stage still shows hard edges, these are flattened by the slope control unit 3 so that the shaped characteristic of the output voltage Vo can be achieved. To provide a delay for the turn-on and turn-off of the voltage controlled current source 4 using the slope control unit 3, the trimming voltage Vtrim can be tuned or the width of any one of the first and second transistors M1 and M2 can be adapted accordingly. Furthermore, a parasitic capacitance on the control node NC mainly provided by the gate terminal capacitance of the fourth transistor M4 can be tuned to provide a calibration of the zero-crossing amplifier unit 1.

Figure 4:
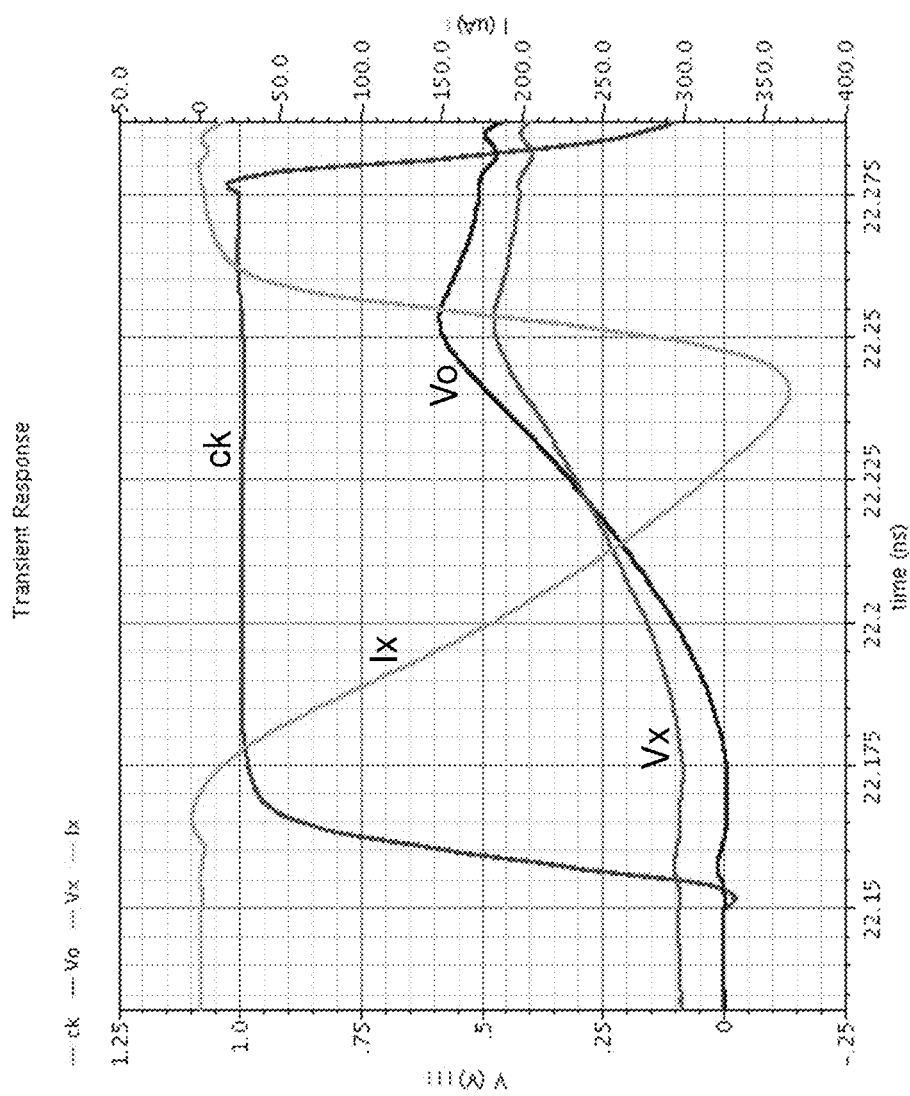
FIG. 4 shows a diagram of the characteristics of the output voltage, the gain stage output voltage and the controlled current for an exemplary zero-crossing amplifier unit of the kind as shown in FIG. 1.

In FIG. 4, a simulated timely characteristic of the clock signal ck, the output voltage Vo, the input voltage Vx and the controlled output current Ix is depicted. It can be seen that with the decreased gradient of the slopes of the controlled output current Ix, the characteristics of the output voltage Vo in relation to the sampling voltage Vx provided a delayed increase, i.e. a slope with a reduced gradient.

REFERENCE LIST

1 . . . zero-crossing amplifier unit
2 . . . gain stage
3 . . . slope control unit
4 . . . voltage-controlled current source
C1 . . . feedback capacitor
C2 . . . input capacitor
ck . . . clock signal
ckb . . . inverted clock signal
CL . . . output capacitor
I . . . input node
Itrim . . . trimming current
Ix . . . controlled output current
O . . . output node
NC . . . control node
M1 to M6 . . . first to sixth transistor
MC1 to MC4 . . . first to fourth clock transistor
VC . . . current control voltage
Vcm . . . common mode voltage
Vdd . . . supply potential
VGND . . . ground potential
Vo . . . output voltage
VSS . . . supply potential
Vt . . . gain stage output voltage
Vtrim . . . trimming voltage
Vx . . . sampling voltage

What is claimed is:

1. A zero-crossing amplifier unit for use in high speed analog-digital-converters, comprising:
a gain stage for comparing a sampling voltage at an input node of the zero-crossing amplifier unit with a provided threshold voltage to obtain a gain stage output signal, wherein the gain stage comprises a first clock transistor and a first transistor connected in series and the input node of the zero-crossing amplifier unit is connected by a feedback capacitor to an output node of the zero-crossing amplifier unit;
a voltage controlled current source that provides a controlled output current depending on a time window between an initial slope and an end slope of the gain stage output signal, wherein the voltage controlled current source comprises a second transistor; and a slope control circuit to increase a duration of a rise and/or fall time of at least one of the initial slope and the end slope of the gain stage output signal, wherein a gate of the second transistor is connected to a current control signal of the slope control circuit.

2. The zero-crossing amplifier unit according to claim 1, further comprising:

an output capacitor that is loaded by the controlled output current and is located between the output node and ground.

3. The zero-crossing amplifier unit according to claim 2, wherein the gain stage is controlled to provide the gain stage output signal with the initial slope at an initial time and with the end slope when the sampling voltage at the input node passes the provided threshold voltage due to the coupling with the output node, and wherein the slope control circuit at least increases the duration of the rise and/or fall time of the initial slope.

4. The zero-crossing amplifier unit according to claim 1, wherein the slope control circuit comprises a current mirror to set a current used for recharging a gate terminal of the second transistor.

5. The zero-crossing amplifier unit according to claim 4, wherein the current mirror is configured to set the current used for recharging the gate terminal of the second transistor by means of at least one of a control current, a control voltage and a transistor parameter.

6. The zero-crossing amplifier unit according to claim 1, wherein the slope control circuit is included in the gain stage to increase the duration of a rise and/or fall time of at least one of the initial slope and the end slope of the gain stage output signal.

7. The zero-crossing amplifier unit according to claim 1, wherein the gain stage comprises a differential amplifier.

8. A method for operating a zero-crossing amplifier unit for use in high speed analog-digital-converters, comprising:

comparing a sampling voltage at an input node of the zero-crossing amplifier unit with a provided threshold voltage to obtain a gain stage output signal, whereby the gain stage output signal is located at a point where a first clock transistor and a first transistor are connected in series;

providing a controlled output current depending on a time window between an initial slope and an end slope of the gain stage output signal, whereby an output capacitor at an output node of the zero-crossing amplifier unit is loaded by the controlled output current; and increasing a duration of a rise and/or fall time of at least one of the initial slope and the end slope of the gain stage output signal.

9. The method according to claim 8, further comprising: coupling the output node of the zero-crossing amplifier unit with the input node of the zero-crossing amplifier unit, at a feedback capacitor, so that a voltage change at the output node is reflected at the input node.

10. The method according to claim 8, further comprising:

controlling a gain stage is to provide the gain stage output signal with the initial slope at an initial time and with the end slope when the sampling voltage at the input node passes the provided threshold voltage due to a coupling with the output node, and increasing the duration of the rise and/or fall time of the initial slope by a slope control circuit.

11. The method according to claim 8, further comprising:

setting a current to recharge a gate terminal of a second transistor with a current mirror of the slope control circuit.

12. The method according to claim 11, further comprising:

configuring the current mirror by means of at least one of a control current, a control voltage and a transistor parameter.

13. A zero-crossing amplifier unit for use in high speed analog-digital-converters, comprising:

a gain stage for comparing a sampling voltage at an input node with a provided threshold voltage to obtain a gain stage output signal;

a voltage controlled current source that provides a load current depending on a time window between an initial slope and an end slope of the gain stage output signal, wherein the voltage controlled current source comprises a first transistor; and a slope control circuit to increase a duration of a rise and/or fall time of at least one of the initial slope and the end slope of the gain stage output signal, wherein the slope control means comprises a current mirror to set a current used for recharging a gate terminal of the first transistor.

14. The zero-crossing amplifier unit according to claim 13, further comprising:

an output capacitor that is loaded by a controlled output current and is located between the output node and ground.

15. The zero-crossing amplifier unit according to claim 14, wherein the gain stage is controlled to provide the gain stage output signal with the initial slope at an initial time and with the end slope when the sampling voltage at the input node passes the provided threshold voltage due to the coupling with the output node, and wherein the slope control circuit at least increases the duration of the rise and/or fall time of the initial slope.

16. The zero-crossing amplifier unit according to claim 13, wherein the current mirror is configured to set the current used for recharging the gate terminal of the first transistor by means of at least one of a control current, a control voltage and a transistor parameter.

17. The zero-crossing amplifier unit according to claim 13, wherein the slope control circuit is included in the gain stage to increase a duration of a rise and/or fall time of at least one of the initial slope and the end slope of the gain stage output signal.

18. The zero-crossing amplifier unit according to claim 13, wherein the gain stage comprises a differential amplifier.

* * * * *